US007709814B2

(12) United States Patent
Waldfried et al.

(10) Patent No.: US 7,709,814 B2
(45) Date of Patent: May 4, 2010

(54) APPARATUS AND PROCESS FOR TREATING DIELECTRIC MATERIALS

(75) Inventors: Carlo Waldfried, Falls Church, VA (US); Christopher Garmer, Rockville, MD (US); Orlando Escorcia, Falls Church, VA (US); Ivan Berry, III, Ellicott City, MD (US); Palani Sakthivel, Odenton, MD (US); Alan C. Janos, Darnestown, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 1233 days.

(21) Appl. No.: 11/155,525

(22) Filed: Jun. 17, 2005

(65) Prior Publication Data

US 2006/0141806 A1    Jun. 29, 2006

Related U.S. Application Data

(60) Provisional application No. 60/581,185, filed on Jun. 18, 2004.

(51) Int. Cl.
*G21K 5/00* (2006.01)

(52) U.S. Cl. .................. 250/492.2; 250/492.1; 438/798; 438/474; 34/275; 34/276; 134/1; 134/94.1; 134/902

(58) Field of Classification Search .............. 250/492.1, 250/492.2; 438/798, 474; 34/275, 276; 134/1, 134/94.1, 902; 257/E21.331, E21.328
See application file for complete search history.

(56) References Cited

U.S. PATENT DOCUMENTS

| | | | | |
|---|---|---|---|---|
| 5,326,406 A * | 7/1994 | Kaneko et al. | ................. | 134/1 |
| 5,541,475 A * | 7/1996 | Wood et al. | ................. | 313/484 |
| 5,705,232 A * | 1/1998 | Hwang et al. | ................ | 427/512 |
| 6,068,783 A * | 5/2000 | Szetsen | ........................ | 216/60 |
| 6,115,521 A * | 9/2000 | Tran et al. | ...................... | 385/52 |
| 6,190,458 B1 * | 2/2001 | Harada | ........................ | 118/715 |
| 6,717,116 B1 * | 4/2004 | Ito et al. | ................... | 219/444.1 |
| 6,936,134 B2 * | 8/2005 | Yonemizu et al. | ....... | 156/345.32 |
| 7,045,798 B2 * | 5/2006 | Elsheref et al. | .......... | 250/492.2 |
| 7,122,454 B2 * | 10/2006 | Olsen | ......................... | 438/542 |

FOREIGN PATENT DOCUMENTS

EP    1 420 439 A2    5/2004

OTHER PUBLICATIONS

International Search Report for International Patent Application No. PCT/US2005/022110 Filed Apr. 22, 2005.

* cited by examiner

*Primary Examiner*—Jack I Berman
*Assistant Examiner*—Hanway Chang
(74) *Attorney, Agent, or Firm*—Cantor Colburn LLP

(57) ABSTRACT

Apparatuses and processes for treating dielectric materials such as low k dielectric materials, premetal dielectric materials, barrier layers, and the like, generally comprise a radiation source module, a process chamber module coupled to the radiation source module; and a loadlock chamber module in operative communication with the process chamber and a wafer handler. The atmosphere of each one of the modules can be controlled as may be desired for different types of dielectric materials. The radiation source module includes a reflector, an ultraviolet radiation source, and a plate transmissive to the wavelengths of about 150 nm to about 300 nm, to define a sealed interior region, wherein the sealed interior region is in fluid communication with a fluid source.

47 Claims, 10 Drawing Sheets

APPARATUS AND PROCESS FOR TREATING DIELECTRIC MATERIALS

CROSS REFERENCE TO RELATED APPLICATIONS

The present application relates to and claims priority to U.S. Provisional Application No. 60/581,185 filed on Jun. 18, 2004, incorporated herein by reference in its entirety.

BACKGROUND

This disclosure generally relates to an apparatus for curing and/or removing porogens from dielectric materials, and in particular, to an apparatus for curing and/or removing porogens from low k dielectric materials with ultraviolet radiation in a controlled environment.

As semiconductor and other microelectronic devices progressively decrease in size, the demands placed on device components continue to increase. For example, the prevention of capacitive crosstalk between interconnect lines becomes significantly more important with smaller devices. Capacitive crosstalk is generally a function of both the distance between conductors and the dielectric constant (k) of the material placed in between the conductors. Considerable attention has been focused on electrically isolating the conductors from each other using new insulators having low dielectric constants because although silica ($SiO_2$), which has traditionally been used in such devices because of its relatively low dielectric constant of about 4, met the requirements of earlier (i.e., larger) applications, it will not be adequate for the smaller devices of the future. These low k (i.e., a dielectric constant less than 4) materials are desirable for use, for example, as inter-layer dielectric layers (ILD).

To achieve low dielectric constants, one can either use a material that possesses a low dielectric constant, and/or introduce porosity into the material, which effectively lowers the dielectric constant because the dielectric constant of air is nominally 1. Porosity has been introduced in low k materials through a variety of means. In the case of spin on low k dielectrics, a lowering of the k value can be achieved by using high boiling point solvents, by using templates or by porogen based methods that form pores upon subsequent processing to remove a sacrificial material. However, the integration of porous low-k materials in the manufacture of the semiconductor device, in general, has proven difficult.

The utilization of UV radiation for the curing of low-k dielectric films has recently been discovered to provide enhanced electrical, mechanical and chemical properties of the resulting dielectric material, as compared to other cure methods. In addition, the UV assisted process is capable to effectively remove porogen material, a sacrificial organic substance that is used to generate porous structures. Test results on different low-k materials have shown that the exposure to different wavelength distributions of UV light combined with the appropriate background chemistry and sufficiently high wafer temperatures results in different modifications of the low-k films. In particular, we have found that some wavelength distributions (A) are very effective for porogen removal and enhanced cross-linking of the low-k matrix, while other wavelength distributions (B) contribute to the cross-linking of the low-k matrix without porogen removal. Therefore a number of different low-k cure flow schemes are possible, which may have benefits for the synthesis and integration of porous low-k dielectrics.

No ultraviolet radiation apparatus currently exists that addresses the special problems and concerns associated with curing and/or removing porogens from various dielectric materials. Accordingly, there is a need in the art for an apparatus suitable for processing dielectric materials such as low k materials, oxides, nitrides, premetal dielectrics, barrier layers, and the like for advanced device fabrication.

BRIEF SUMMARY

Disclosed herein are apparatuses and processes for treating dielectric materials such as low k dielectrics, premetal dielectrics, and the like for advanced semiconductor devices. In one embodiment, the apparatus comprises a radiation source module comprising a reflector, an ultraviolet radiation source, and a plate transmissive to the wavelengths of about 150 nm to about 300 nm, to define a sealed interior region, wherein the sealed interior region is in fluid communication with a first fluid source; a process chamber module coupled to the radiation source module to define a sealed chamber in operative communication with the ultraviolet radiation source, the process chamber comprising a closable opening adapted to receive a substrate, a support adapted to support the substrate, and a gas inlet in fluid communication with a second fluid source; and a loadlock chamber module in operative communication with the process chamber and a wafer handler; the loadlock chamber comprising an airlock chamber in fluid communication with a third fluid source and a chuck.

In another embodiment, an apparatus for processing dielectric materials comprises a radiation source module comprising a reflector, an ultraviolet radiation source adapted to emit broadband radiation, a plate transmissive to the wavelengths of about 150 nm to about 300 nm, to define a sealed interior region, wherein the sealed interior region is in fluid communication with a first fluid source; an optical filter disposed between the radiation source and the substrate; and a process chamber module coupled to the radiation source module to define a sealed chamber in operative communication with the ultraviolet radiation source, the process chamber comprising a closable opening adapted to receive a substrate, a support adapted to support the substrate, and a gas inlet in fluid communication with a second fluid source.

A process for treating a dielectric material comprises transferring a substrate from a loadlock chamber into a process chamber, wherein the process chamber is coupled to a radiation source module comprising a reflector, an ultraviolet radiation source, and a plate to define a sealed interior region, wherein the plate is transmissive to wavelengths of about 150 nm to about 300 nm; flowing an inert gas into the process chamber and the sealed interior region; and generating ultraviolet broadband radiation at wavelengths of about 150 nm to about 300 nm and exposing the substrate to the ultraviolet broadband radiation.

The above described and other features are exemplified by the following figures and detailed description.

BRIEF DESCRIPTION OF THE DRAWINGS

Referring now to the figures wherein like elements are numbered alike.

DETAILED DESCRIPTION

Figure 1:
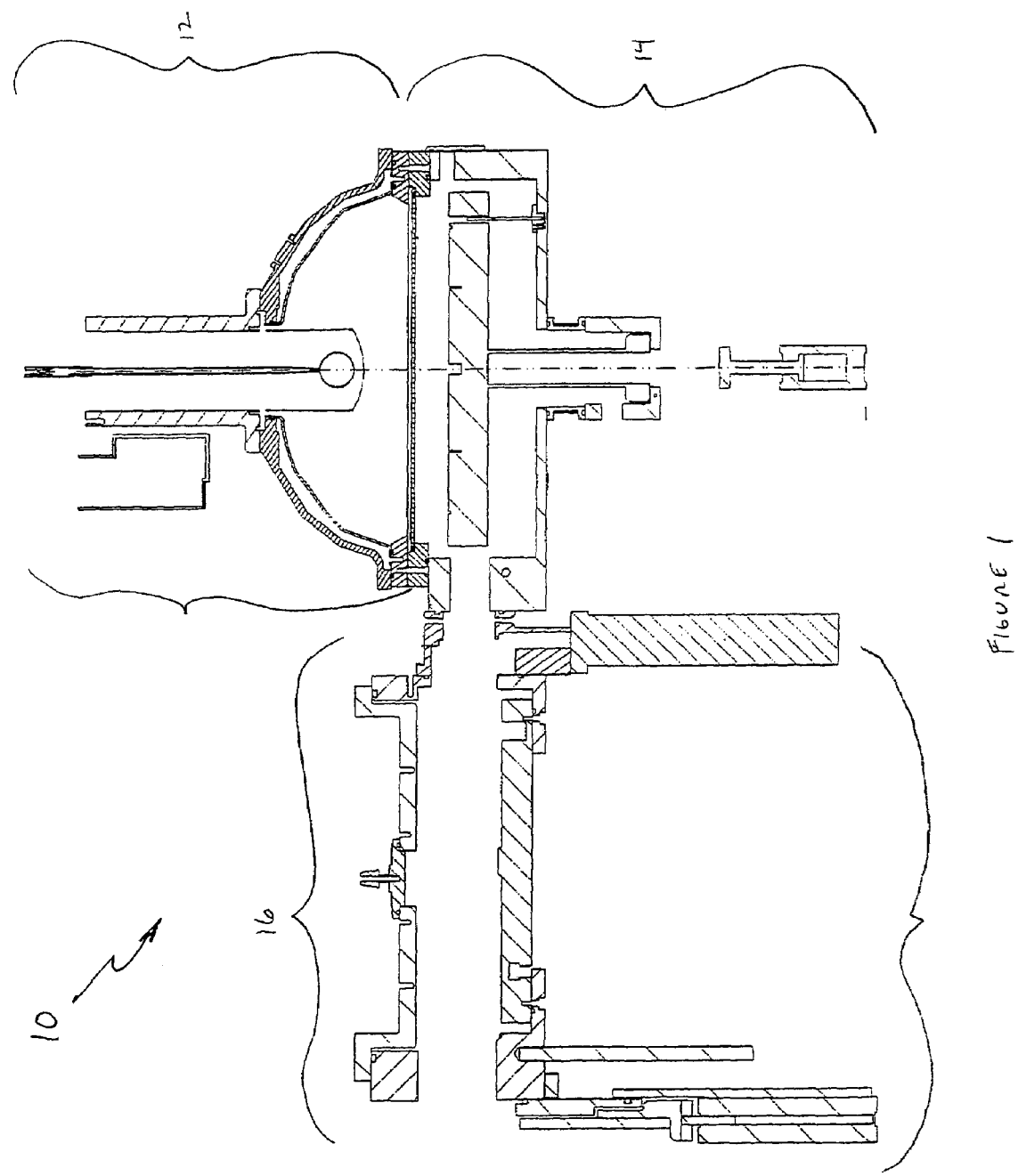
FIG. 1 illustrates a cross sectional view of an apparatus for processing dielectric materials during the fabrication of an integrated circuit including a radiation source module, a process chamber module, and a loadlock chamber module.

As shown in FIG. 1, an apparatus 10 for curing and/or removing porogens from dielectric materials with ultraviolet radiation in a controlled environment generally includes a radiation source module 12, a process chamber module 14 in operative communication with the radiation source module 12, a load lock chamber module 16 proximate to the process chamber module 14 for transferring substrates in and out of the process chamber module 14, and a wafer load station module (not shown) proximate to the load lock chamber module 16 for staging substrates for processing with the apparatus 10. Advantageously, the environment within each module can be controlled and tailored for the particular dielectric material being processed therein.

Figure 2:
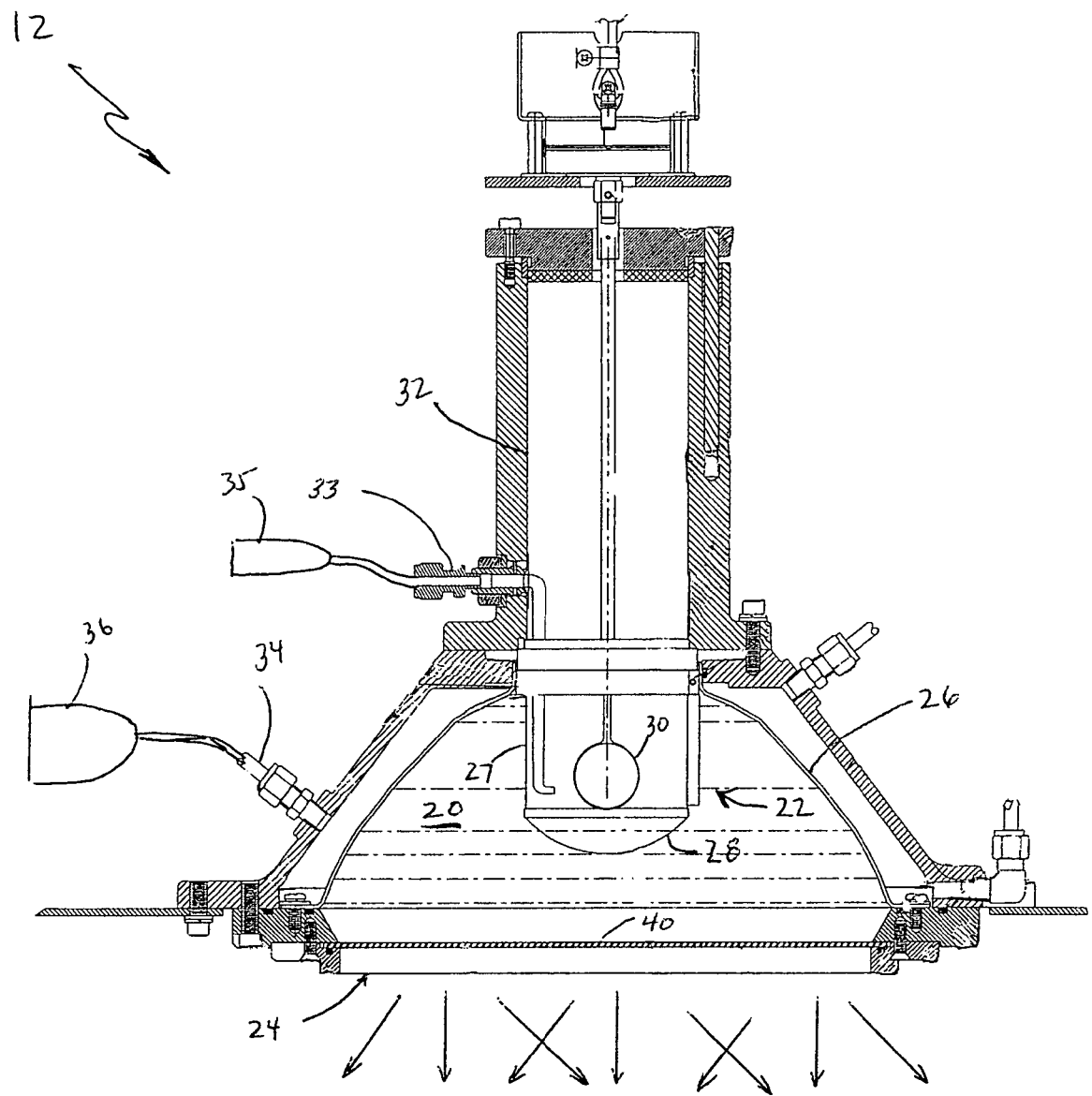
FIG. 2 illustrates a cross sectional view of the radiation source module of FIG. 1.

Referring now to FIG. 2, the radiation source module 12 generally comprises a sealed interior region 20 defined by an ultraviolet radiation source 22, a plate 24, and a reflector 26. A portion 27 of the ultraviolet radiation source 22 protrudes from and/or interfaces with the sealed interior region 20 and is substantially transmissive to ultraviolet radiation and substantially opaque to microwaves, thereby acting as a high pass filter. For example, the terminal end 28 of portion 27 protruding from and/or interfacing with the sealed interior region 20 can be formed of an tungsten mesh material with sufficiently small openings to cut-off most microwave radiation while substantially transmitting the ultraviolet radiation.

The reflector 26 includes a reflecting layer formed of an aluminum metal, a dichroic material, or a multilayer coating. Optionally, the reflecting layer may further comprise a protective layer of magnesium fluoride, silicon dioxide, aluminum oxide, and combinations comprising at least one of the foregoing materials. Other suitable materials will be apparent to one of ordinary skill in the art in view of this disclosure. It has been discovered that these materials provide greater and more efficient reflectance of ultraviolet radiation having shorter wavelengths, e.g., wavelengths less than 200 nm.

The radiation source module 12 further includes a fluid inlet 33 in fluid communication with the sealed interior region 20 and a fluid source 35. The fluid source 35 is configured to purge the atmosphere contained within the sealed interior region 20 during operation. In addition, the fluid source 35 can be used to cool the ultraviolet radiation source, e.g. the electrodeless bulb. Suitable fluids include, but are not intended to be limited to, inert gases for purging ambient air, for example, from the sealed interior region 20. Suitable inert gases include, but are not limited to, nitrogen, argon, helium, combinations comprising at least one of the foregoing gases, and the like. Similarly, the sealed interior region 20 can also be evacuated by means of a vacuum pump, exhaust, or the like (not shown) to allow optimum transmission of UV light. That is, oxygen or other species that absorb ultraviolet radiation at wavelengths less than 200 nm can be removed. As used herein the term, "sealed" as used in reference to the radiation source module (as well as the process chamber) refers to a region within the radiation source module that can be suitably purged during operation. The sealed interior region does not need to be vacuum-sealed and purging can simply provide a positive atmosphere within the interior region (or process chamber). Although in some embodiments, the sealed interior region can be vacuum-sealed depending on the application.

The radiation source chamber 12 can also include fluid inlet 34 in fluid communication with a fluid source 36. In this manner, fluid such as water or some other cooling medium can be used to provide cooling to the reflector 26 or like components that may become heated during operation. For example, the reflector 26 may further include a water-cooling jacket wherein the fluid flows therethrough to provide the desired amount of cooling. The fluid selected for cooling can be the same or different from the fluid used for purging the sealed interior region 20. As such, fluid sources 35 or 36 are not intended to be limited to a single fluid and can provide multiple fluids as may be desired for different applications, wherein each fluid can be stored in a pressurized vessel or the like in fluid communication with inlet 33, 34, via a manifold or the like.

Purging the sealed interior region 20 of the radiation source module 12 (as well as the process chamber 14) provides numerous advantages during processing of low k dielectric materials, among others. For example, air includes about 21% oxygen, which is known to absorb radiation at wavelengths less than about 200 nm and reacts to form, among other products, ozone. The production of ozone, in turn, exacerbates wavelength attenuation since ozone starts absorbing as high as 250 nm and continues to lower wavelengths. As a result, the process efficiency for ultraviolet curing and/or removal of porogens from the low k material can decrease. Purging the sealed interior region 20 of the radiation source module 12 (and the process chamber 14) or evacuating it prior to exposing a substrate to an ultraviolet radiation pattern reduces wavelength absorption and as a result, increases process efficiency. Other purging fluids can be used to absorb selected wavelengths of the ultraviolet radiation pattern specific to the particular radiation source employed. Suitable absorbing gases include, but are not intended to be limited to, $O_2$, $O_3$, $N_2O$, $CO_2$, $H_2O$ and the like.

The radiation source module 12 is preferably adapted to emit a broadband radiation pattern having at least one broadband wavelength pattern less than about 400 nm, with about 150 nm to about 300 nm more preferred, and with about 150 nm to about 250 nm even more preferred.

The radiation source module 12 as shown illustrates the use of a electrodeless bulb 30, which is coupled to an energy source, e.g., a microwave cavity, to emit the broadband radiation pattern in a manner well known by those skilled in the art to generate the desired broadband ultraviolet radiation pattern. Using a microwave energy source as an example, a magnetron and a waveguide are coupled to the microwave cavity 32 to excite a gas fill within the electrodeless bulb and produce ultraviolet radiation. Different fills can be employed with the microwave electrodeless bulb 28 to provide different radiation patterns. The amount of the fill is such that it can be present at a pressure of at least about 1 atmosphere and preferably 2 to 20 atmospheres at operating temperature when the fill is excited at a relatively high power density. For example, the power density of microwave energy would be at least 50 watts/cc, and preferably greater than 100 watts/cc. The electrodeless bulb 28 can also be made to emit a desired broadband radiation pattern with radiofrequency power.

Figure 3:
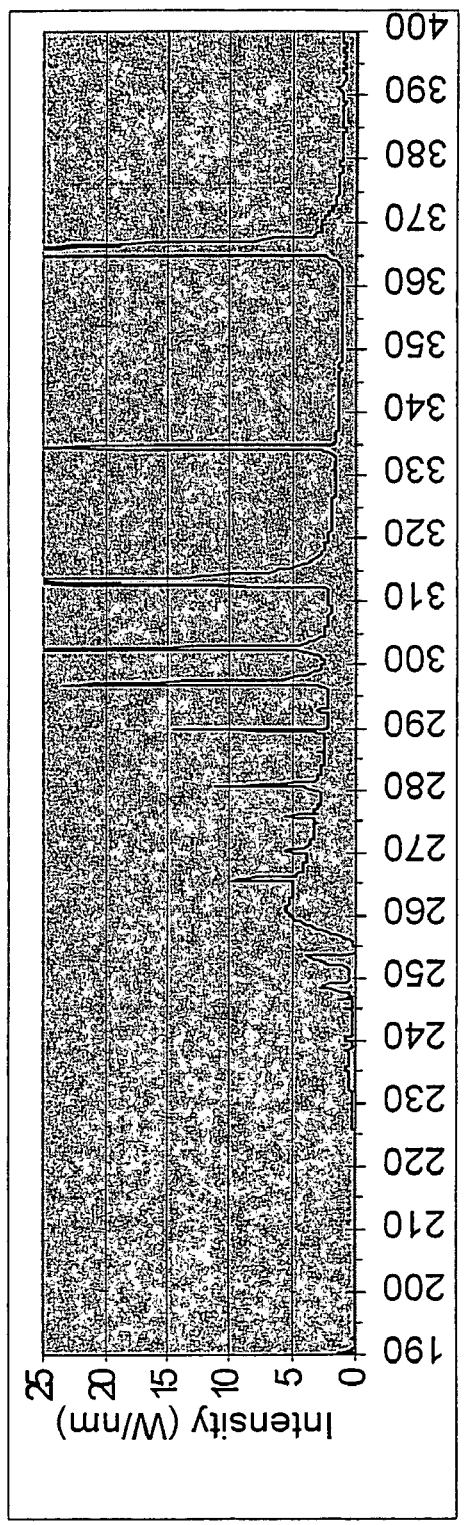
FIG. 3 graphically illustrate the broadband spectral output of a Type I electrodeless microwave driven bulbs from Axcelis Technologies, Inc., which can be suitably used as an ultraviolet radiation source.
Figure 4:
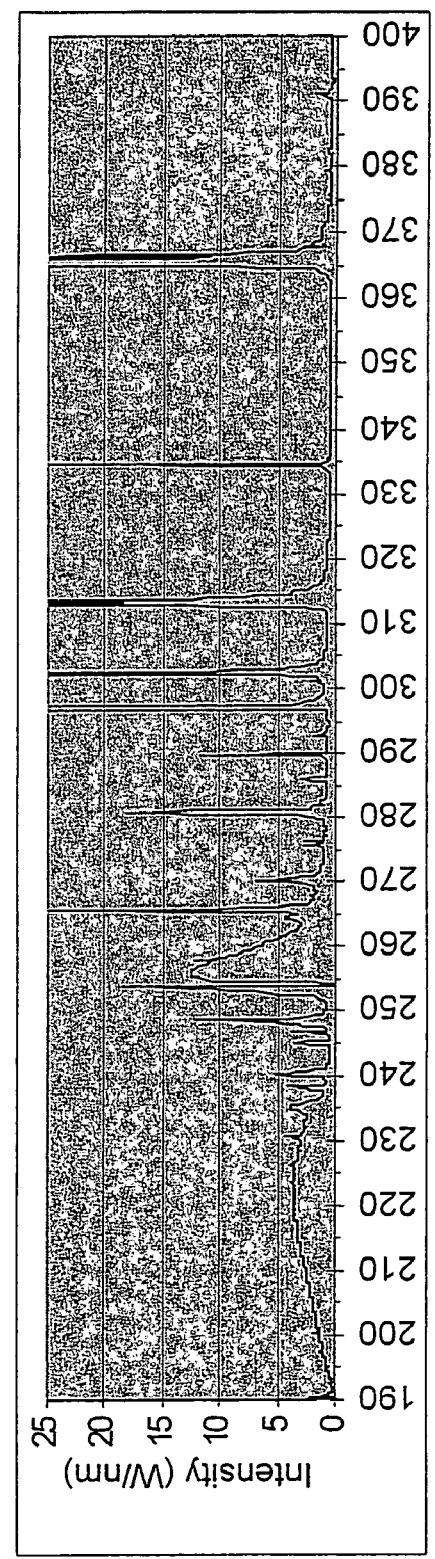
FIG. 4 graphically illustrate the broadband spectral output of a Type II electrodeless microwave driven bulb from Axcelis Technologies, Inc, which can be suitably used as an ultraviolet radiation source.

The UV generating electrodeless bulbs with different spectral distributions may be selected depending on the application such as, for example, the use of different microwave electrodeless bulbs, e.g., Type I and Type II microwave electrodeless bulbs available from Axcelis Technologies (Beverly, Mass.). Spectra obtained from the Type I and Type II bulbs and suitable for use in a curing and/or porogen removal process are shown in FIGS. 3 and 4, respectively. Other suitable microwave driven electrodeless bulbs are disclosed in U.S. Pat. No. 5,541,475 to Wood et al., incorporated herein by reference in its entirety. Optionally, in place of the electrodeless bulb, an arc discharge, a dielectric barrier discharge, or an electron impact generator can be used to emit the desired ultraviolet radiation pattern.

For example, the dielectric barrier discharge light source generally includes two parallel electrodes with a dielectric-insulating layer disposed on or between one of the electrodes and generally operates at about atmospheric pressures. The substrate to be treated is often used as one of the planar electrodes or typically is placed between two planar electrodes. This dielectric barrier discharge light source is preferably capable of being backfilled with any number of gas mixtures for producing a desired radiation pattern. A computer control can be employed to alter the gas mixture during operation to allow changing of the emitted wavelengths in the radiation pattern.

In one embodiment, the substrate is heated from beneath by high intensity lamps while being illuminated from above by the light source. This would provide a programmable substrate temperature. In this embodiment, pins could be employed to support the substrate over a heating window, below which the heating lamps would be located. In this embodiment, one or more of the pins would optionally contain a temperature sensor, e.g., a spring mounted or an embedded thermocouple, to monitor the substrate temperature and feed back this temperature information to a lamp controller to control the temperature, if desired. Alternatively a proximity thermal chuck controls the substrate temperature with an embedded closed loop thermocouple control.

The plate 24 within the radiation source module 12 advantageously serves to isolate the ultraviolet radiation source 22 from the underlying process chamber 14 (as previously shown in FIG. 1). Advantageously, the plate 24 eliminates particulate contamination from the substrate to the ultraviolet radiation source 22, isolates the ultraviolet radiation source 22 from the process chamber 14 to permit separate access, and, additionally, permits the use of gases to cool the ultraviolet radiation source 22 and/or microwave cavity, if present. The plate 24 also allows specially chosen process gases to be used in the process chamber 14 without interfering with the operation of the ultraviolet radiation source 22.

In one embodiment, the plate 24 is fabricated from a quartz material having an optical transmittance substantially transparent to the desired radiation pattern for curing and/or removing porogens from the low k dielectric material. An example of such a quartz material is commercially available under the trade name Dynasil 1000 from the Dynasil Corporation in West Berlin, N.J. It may be possible to use materials other than quartz, so long as the materials possess the above characteristics. For example, it may be desirable to expose the substrate to ultraviolet radiation having wavelengths below 220 nm specific for porogen removal. The plate 24 is mounted by conventional mounting means in the radiation source module 12, which may optionally include suitable spacers. Furthermore, the plate 24 may be comprised of one or more stackedly arranged plates. In some embodiments, the plate may be coated with an anti-reflectant to minimize back reflections of UV radiation into the radiation source module 12. For example, the plate 24 may be coated with magnesium fluoride or may have deposited thereon silicon, fluorine, and the like.

Figure 5:
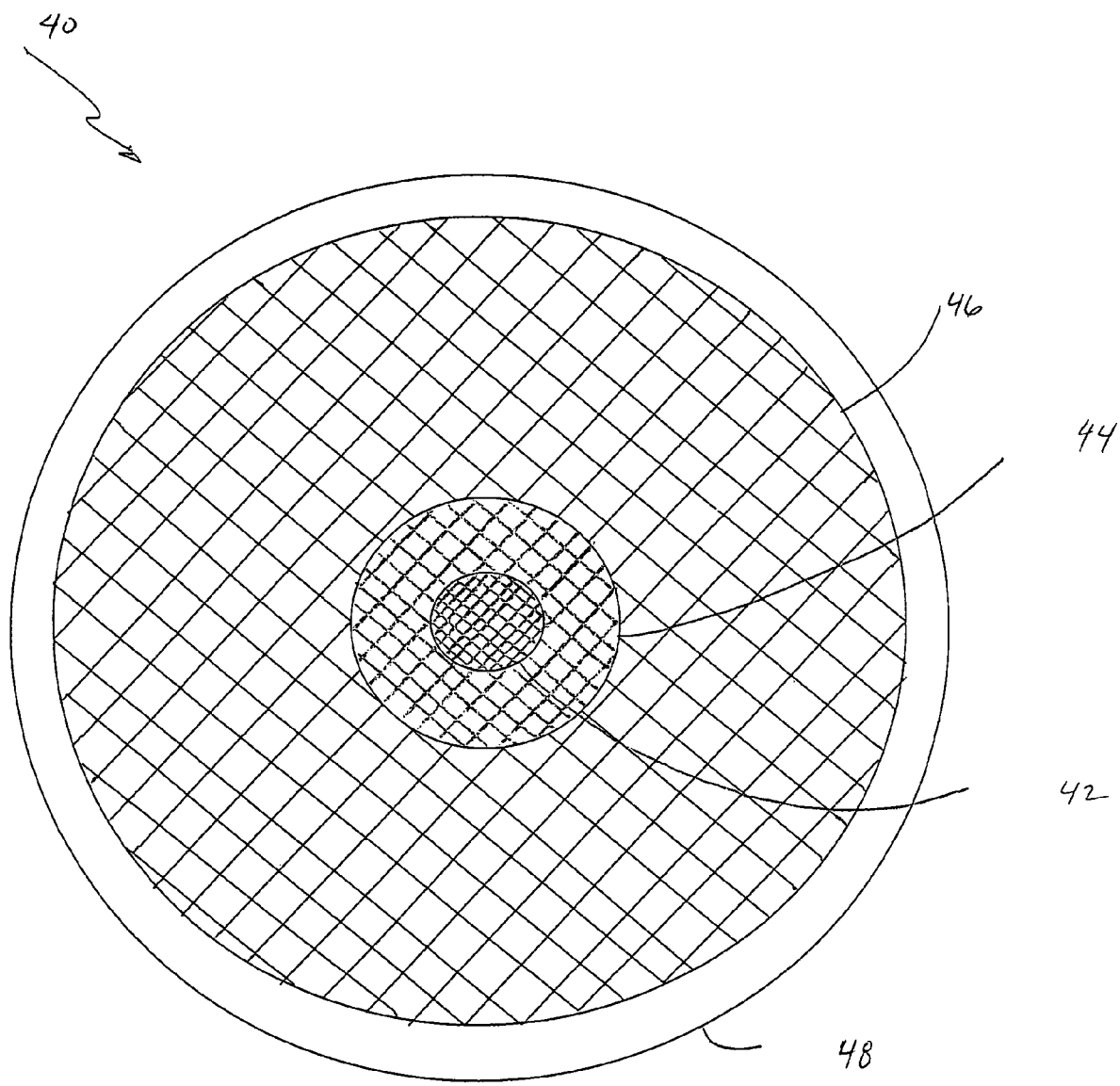
FIG. 5 illustrates a top plan view of a screen intermediate the process chamber module and the radiation source module of FIG. 1.

In one embodiment, an optical filter 40, e.g., a screen or the like, is disposed on the plate 24. In the case of a screen, the screen 40 is preferably configured with a plurality of openings, which provide improved uniformity of irradiation to substrate. The openings can vary in size depending on the intensity characteristics of the ultraviolet radiation source so as to promote uniform radiation to an underlying substrate. The screen 40 can be fabricated from a metal and have a mesh form. The screen 40 can include a single zone or multiple zones to provide greater radiation exposure uniformity. FIG. 5 illustrates an exemplary screen 40 having three zones 42, 44, and 46. Zone 42 has a finer mesh pattern than zone 44, which has a finer mesh pattern than zone 46. It has been discovered that without the screen, the centermost portion of the substrate exhibits the greatest intensity of radiation incident to its surface. By changing the aperture density of screen 40 in the manner illustrated, greater radiation uniformity can be obtained. An annular ring 48 retains the mesh screen defined by zones 42, 44, and 46.

In another embodiment, the screen 40 is disposed intermediate the process chamber module 14 and the radiation source module 12. In still another embodiment, the screen 40 is embedded within the plate 24.

Figure 6:
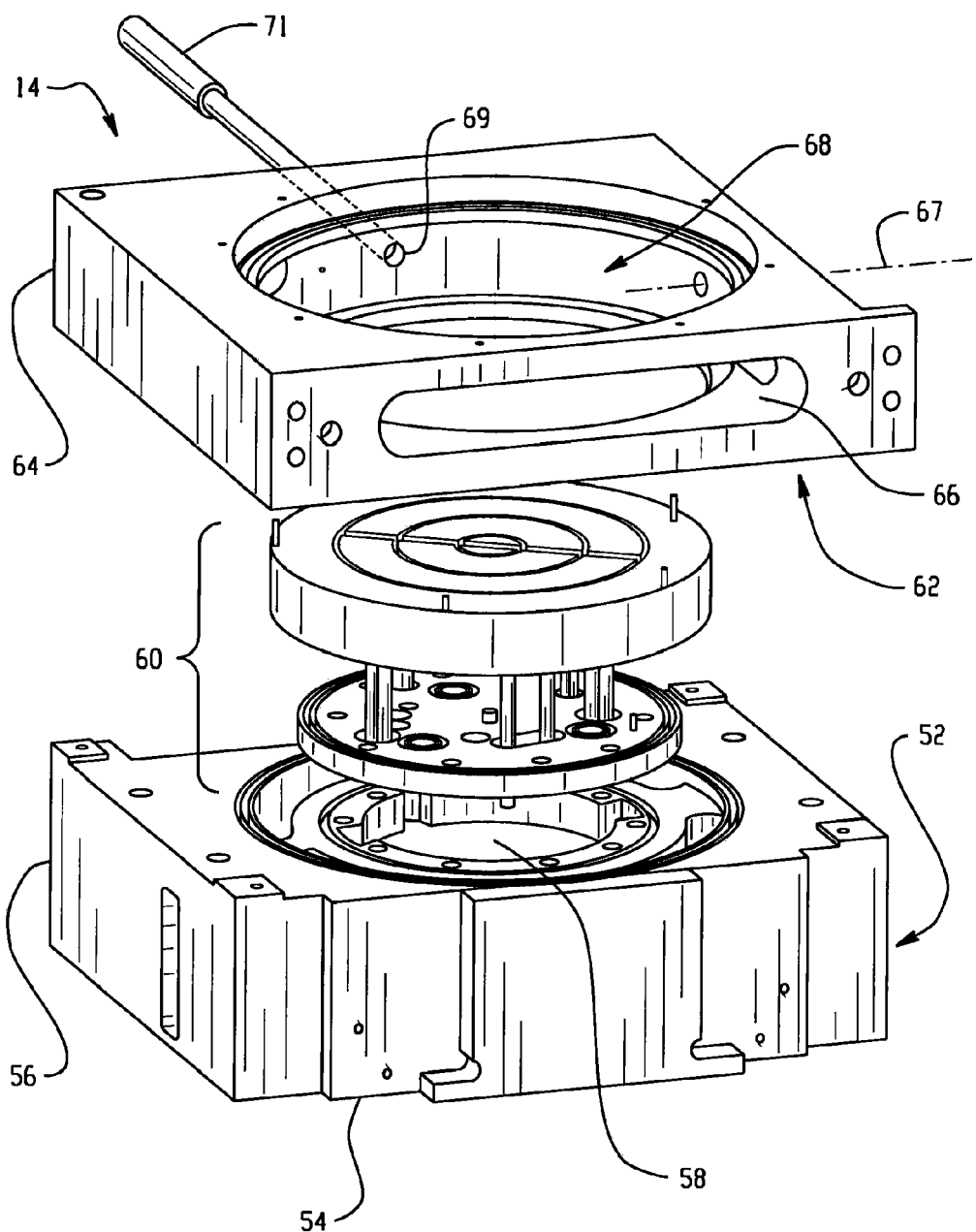
FIG. 6 illustrates a exploded perspective view of the process chamber module of FIG. 1.

As shown more clearly in FIG. 6, the process chamber 14 generally includes a base unit 52 comprising a bottom wall 54 and sidewalls 56 extending therefrom to form a cavity 58. A chuck assembly 60, e.g., a gravity chuck assembly, or the like, is disposed in the cavity 58. As is generally known to those skilled in the art, the gravity chuck assembly employs gravity as a means for securing the substrate to a support surface such that the substrate is not forced in contact with the support surface by any means other than the weight of the substrate. The chuck may further include a vacuum hold mechanism as may be desired for some applications and chuck assemblies.

Coupled to the base unit 52 is structure 62 defined by sidewalls 64 extending therefrom, which is further coupled to the radiation source module 12 to form a sealed chamber 68 in which the substrate can be processed. The process chamber 14 is preferably fabricated from materials inert to the operating environment including, but not limited to, processing gases and reaction byproducts. The sidewalls 64 of the structure 62 include at least one opening 66. Opening 66 is dimensioned for transferring substrates into and out of the process chamber 14 from an adjacent loadlock chamber 16 (also shown in FIG. 1).

Other openings (not shown) may also be disposed in the sidewalls 64 for purposes generally known in the art such as, for example, inlet and exhaust/pump manifolds, an optical port for monitoring the process, a mass spectrometer inlet for analyzing gaseous species evolved during processing, e.g., porogens, an oxygen analyzer for monitoring the concentration of oxygen, or the like. For example, an inlet and exhaust manifold may be employed to provide a cross flow of gases proximal to the transmissive plate during purging and/or processing. Still further, the process chamber may include an outlet connected to an exhaust or vacuum pump such that the flow of fluids provides a gas curtain proximal to the transmissive plate so as to minimize deposition of porogen or any outgassed material from the substrate during processing, or to clean a coated plate by using UV activation of a reactive gas within the process chamber 14. In one embodiment, the fluid flow into the process chamber for forming curtain comprises an inlet slot and an opposing outlet slot in proximity to the transmissive plate to effect cross flow of the fluid across the plate, thereby providing the curtain.

The process chamber 14 further includes at least one gas inlet 69 in fluid communication with gas a source 71 and the sealed interior region 68. Fluid flow into the sealed chamber 68 can be axial, cross flow, or the like depending on the desired application. For example, the process chamber 14 can be adapted for downstream flow of gases during a purging and/or cleaning process. As such, the purging system, depending on the gases plumbed into the system, can provide preparation of the chamber for an inert condition; and/or chamber cleaning. For example, an in-situ chamber clean function may be desirable since some dielectric materials emit organic volatiles during the curing and/or porogen removal process resulting in deposition of these organic volatiles on the chamber walls and the irradiator plate 24. The in-situ clean function comprises an operating mode at which a substrate-less chamber 14 is purged with oxygen (and/or a reactive gas) and exposed to ultraviolet radiation to generate sufficient amounts of ozone and other excited oxygen species that can react with and remove the organic deposits. For example, periodically cleaning the process chamber includes detecting a change in transmission of the ultraviolet broadband radiation into the process chamber, wherein when the change exceeds a predetermined threshold value, the cleaning process is triggered. Discontinuing the cleaning process occurs when a rate of change of transmission falls below a predetermined rate of change or is at about a 100% transmission for a predefined wavelength band.

For purge operations, the purge system is preferably designed for multiple gas options such as He, $N_2$, Ar, and the like as well as absorbing gases as previously described. For some dielectric cure applications, the addition of small amounts of reactive gases may be desirable to enhance the cure results. Thus, the apparatus can be equipped with one or more mass flow controlled gas channels that enable the controlled introduction of reactive gas species, such as $O_2$, CO, $CO_2$, $C_xH_y$, $C_xF_y$, $N_xH_y$, and the like, wherein x and y are each independently generally greater than 1 to about 10.

The process chamber 14 may further contain an oxygen sensor 67 for detecting the amount of oxygen contained within the chamber. A feedback loop can be provided to prevent operation of the apparatus until the oxygen level is below a predetermined amount. As is known in the art of advanced semiconductor manufacturing, the presence of oxygen can cause unwanted oxidation of the metal interconnects as well as affect treatment of the dielectric materials at high temperatures.

Figure 7:
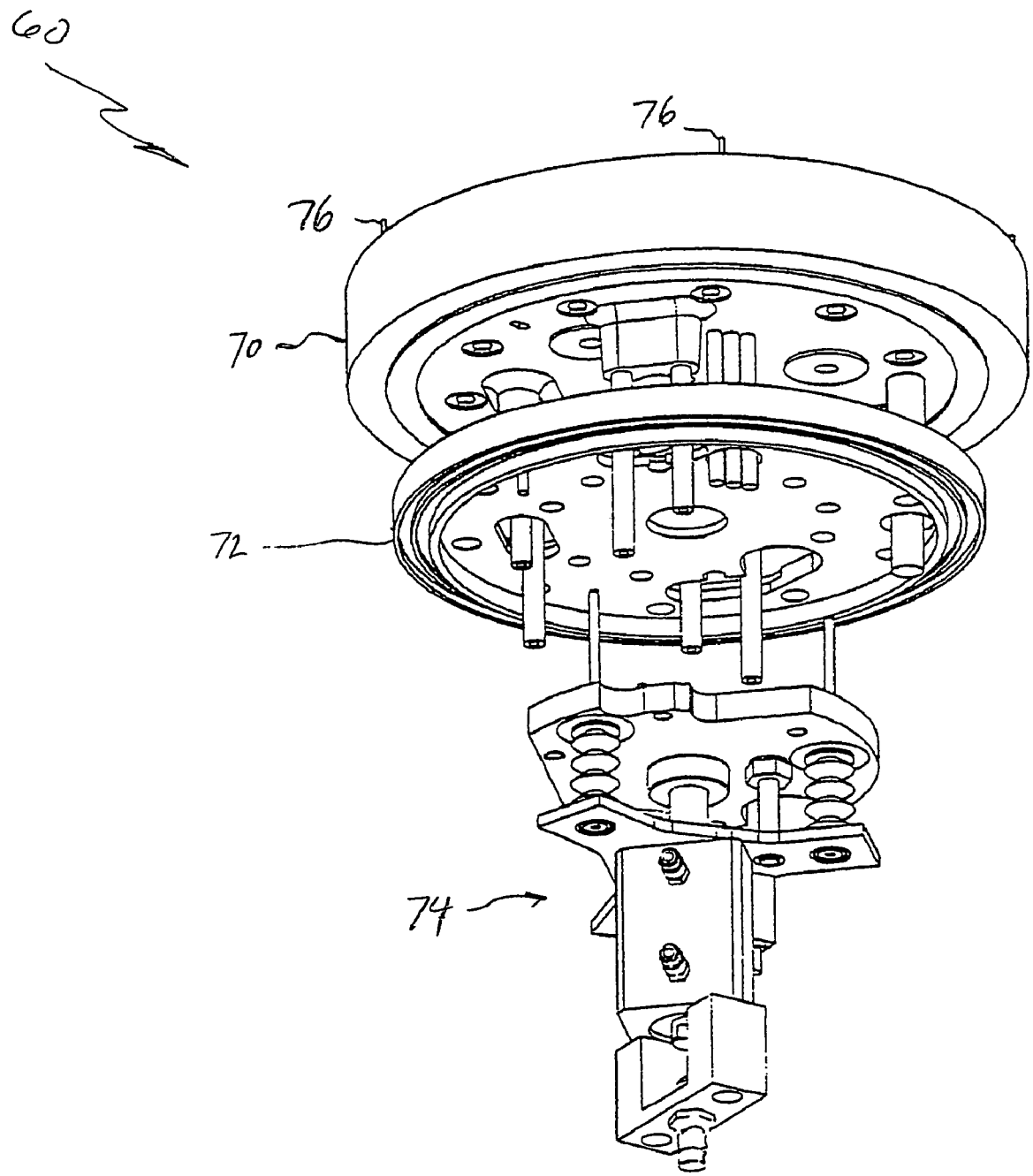
FIG. 7 illustrates a partially exploded perspective view of a proximity thermal chuck assembly for use in the process chamber.

As shown in FIG. 7, the chuck assembly 60 generally includes a support 70, an annular isolation ring 72, and a lift pin assembly mechanism 74. The annular isolation ring 72 is sealingly disposed between a lower surface of the support 70 and the base unit 52 of the process chamber 14. The planar surface of the support 70 includes multiple perimeter pins 76, two of which are shown in FIG. 7. In one embodiment, the support 70 is stationary, i.e., non-rotating. In another embodiment, the support 70 is fabricated from aluminum or an aluminum alloy.

The lift pin assembly mechanism 74 is disposed below the support 70 and includes an air cylinder or the like for actuating the lift pins 76 through lift pin sleeves 96 (see FIG. 8) during processing. The airlines necessary to operate the lift pin mechanism 74 as well as any other plumbing required for the apparatus 10 are preferably disposed in a selected one of the sidewalls in the base unit 52. In other embodiments, the chuck moves vertically to contact the substrate while supported by the pins.

Figure 10:
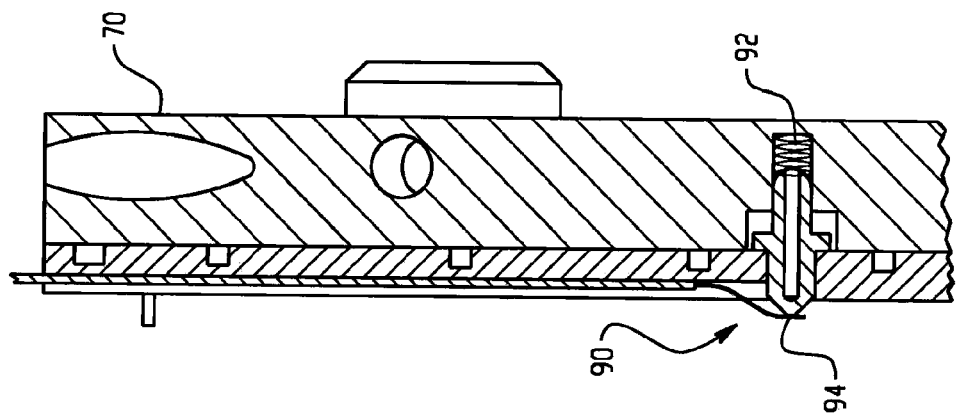
FIGS. 9 and 10 illustrate cross sectional views of the support in FIG. 8.
Figure 9:
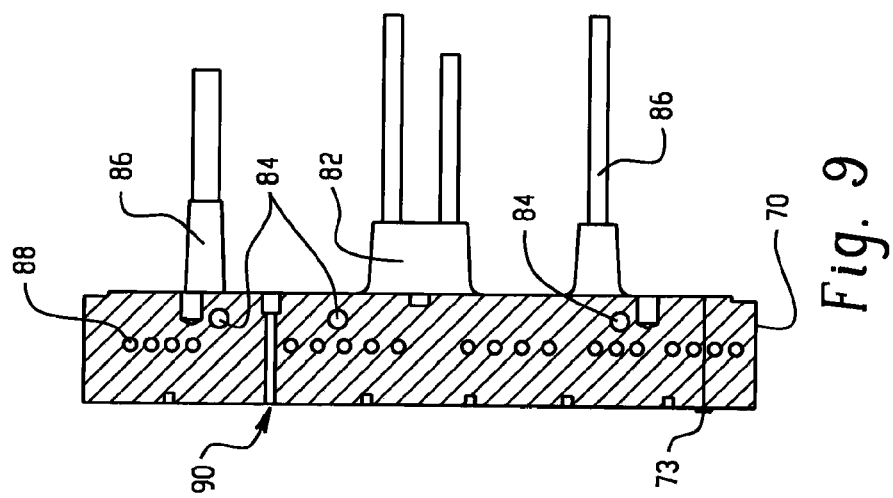
Figure 8:
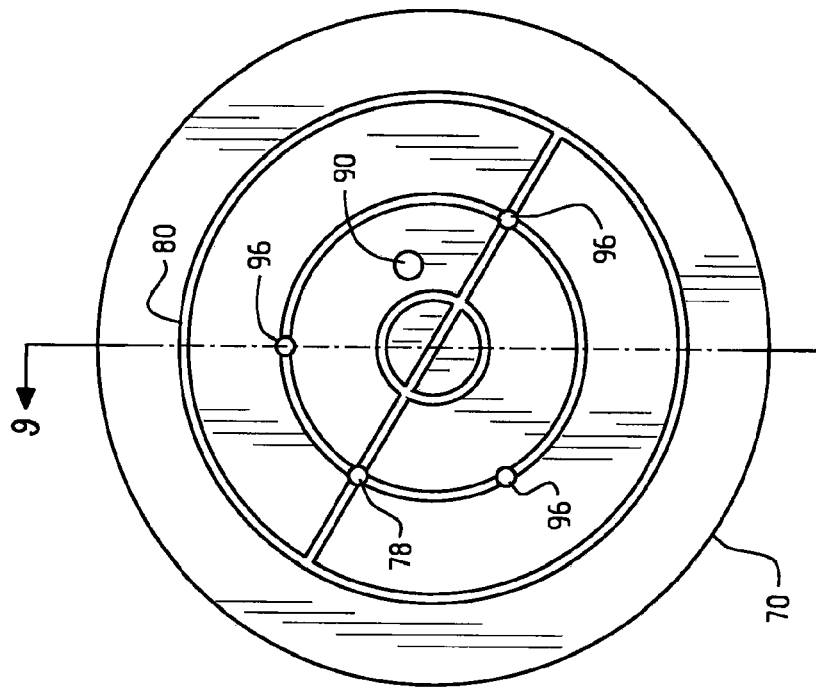
FIG. 8 illustrates a top plan view of a support employed in the proximity thermal chuck assembly of FIG. 7.

As shown more clearly in FIGS. 8-10, the support 70 includes a planar surface upon which a substrate is placed during processing. Optionally, the support 70 includes gas transfer holes 78 and passages 80 extending therethrough such that a heat transfer gas, e.g., helium or the like, can be passed through the holes 78 and/or passages 80 to increase the heat transfer rate between the substrate and surface of the support 70. The holes 78 and/or passages 80 may also be employed for providing a vacuum to the backside of the substrate 38 for increasing the number of contact points between the bottom surface of the substrate and the surface of the support 70 such as by elastic deformation of the substrate. If a vacuum hold down is utilized, the increased number of contact points between the substrate and the surface of the support 70 resulting from the vacuum increases the rate at which the substrate comes to process temperature. In this case, the holes 78 and/or passages 80 are preferably connected to a vacuum line 82, which, in turn, is connected downstream of a process chamber isolation valve, a flow control valve, or the like (not shown). Advantageously, the decrease in time-to-process temperature reduces the overall process time.

Passages 84 (FIG. 9) may also be machined or cast in the support 70 such that a fluid from a cooling system may be circulated to further control the temperature of the substrate. In this manner, the fluid is circulated through cooling conduits 86, which are in fluid communication with passages 84. Resistance heating elements 88 (FIG. 9) may also be cast into the support 70 enabling elevated processing temperatures that may be utilized for increased tool throughput. The support 70 preferably has a shape corresponding to that of substrate and is preferably capable of an operating range of about 200 to about 450° C. In a preferred embodiment, the operating temperature of the support 70 can be varied preferably via a feedback or a closed loop control system using a proportional integral derivative (PID) controller having a heating and cooling capability. The controller would alternately supply a current to heating elements 88 or cooling fluid (air or water) to passages 84 in support 70, as needed. Feedback to the PID controller would be provided by measuring the temperature of substrate during the process using a temperature measuring device such as a spring activated thermocouple 90 mounted within the surface of support 70 as shown in FIG. 10. The thermocouple 90 comprises a spring 92 in operable communication with a contact portion 94 such that the contact portion 94 maintains contact with the backside surface of substrate during support thereof. Alternatively, the temperature of support 70 can be controlled with an open loop process (i.e., without a feedback device) by adjusting the current supplied to heating elements 88 and allowing fluid flow (air or water) through passages 84 cast into support 70 at the appropriate point in the process. Still further, the thermocouple can be embedded within the chuck support to measure the temperature of the substrate Optionally, support 70 includes an irradiance probe 73 for measuring the intensity and spectral characteristics of the ultraviolet radiation. The probe 73 can function in the absence of an overlying substrate to provide a means for characterizing the ultraviolet radiation pattern prior to exposing substrates, which as noted above is dependent on a variety of parameters, e.g., gas fill, bulb cooling, gases within the process chamber, the transmission of the plate, and the like.

Advantageously, the above described process chamber 14 provides a substantially sealed environment for processing the substrate. It has been demonstrated that the quality of the cure (and/or porogen removal) and the integrity of the low-k materials depend on a highly inert ambient. The purged sealed structure helps to provide an inert environment having an oxygen concentration of less than 100 parts per million (ppm), and more preferably less than 50 parts per million and even more preferably less than 20 parts per million. A minimum purge gas flow may be used (even in the standby mode) to maintain the process chamber at a substantially oxygen-free gas filling.

Figure 11:
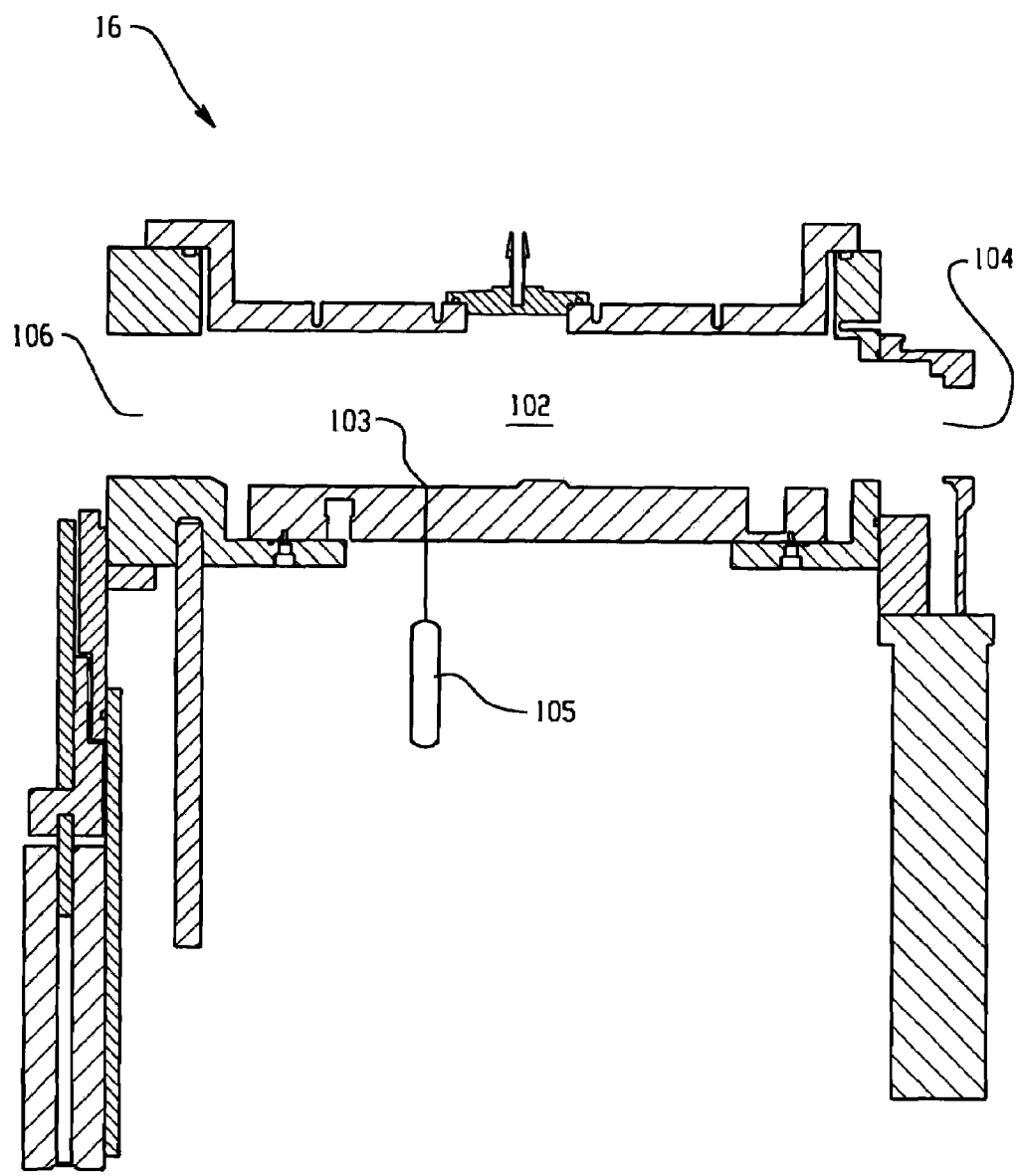
FIG. 11 illustrates a cross sectional view of the loadlock chamber module of FIG. 1.

Turning now to FIG. 11, the loadlock chamber module 16 includes an airlock chamber 102 in operative communication with the processing chamber 14 and a wafer handler (not shown). An opening 104 is disposed in a sidewall of the airlock chamber 102 in operative communication with opening 66 (see FIG. 6) of the process chamber. The airlock chamber 102 includes an additional opening 106 for introducing and removing substrates from the airlock chamber 102. Such a loadlock chamber module 16 can be adjusted to match the operating pressure in the processing chamber 14, thereby allowing transfer of substrates into or out of the process chamber 14 while also allowing the process chamber 14 to maintain a relatively constant pressure, e.g., atmospheric. Moreover, the loadlock chamber 16 includes at least one gas inlet 103 for introducing an inert gas from at least one gas source 105 into the airlock chamber 102. By maintaining an inert atmosphere in the airlock, oxidation of the materials on the substrate, e.g., metal interconnects, low k dielectric, and the like, can be substantially prevented. As the processed substrate is removed from the process chamber, the substrate is generally at an elevated temperature (after having been exposed to ultraviolet radiation in the process chamber typically at an elevated temperature between about 20° to about 450° C., which can exacerbate oxidation of the low k material as well as the metal interconnects in the presence of oxidizing gases, e.g., CO, $CO_2$, $O_2$, ozone, and the like. By maintaining an inert atmosphere until the substrate is sufficiently cooled, minimal oxidation, if any, can occur. Maintaining an inert ambient in the load-lock also helps to minimize the transfer of undesired species into the process chamber.

The loadlock chamber module 16 includes at least one robotic arm (not shown) for transferring the substrate to/from the process chamber and to/from the airlock chamber and to/from the wafer handler. The robotic arm can be a single arm whose travel moves a wafer in a substantially linear manner. The airlock chamber preferably includes a chuck for cooling the substrate after processing.

In another embodiment, since plasmas can be additionally be used to alter dielectric materials and/or remove porogens, the apparatus 10 may be modified to include one or more plasma reactors in addition to the UV processing chambers disclosed herein above. The plasma chambers can utilize RF or microwave frequencies for excitation of oxidizing, reducing or neutral plasma chemistries. Substrates processed in these chambers could be heated by either a hot chuck or by lamps.

In another embodiment, a pre-heating station (not shown) may be added prior to UV exposure, to remove most of the volatiles that outgas from the substrate, before introducing it into the process chamber.

During operation, a substrate is loaded from the wafer handler module into the airlock chamber 102 of the loadlock chamber module 16 at atmospheric pressure. The atmosphere is preferably purged with an inert gas to remove oxidizing gases, e.g., air, from the airlock chamber 102. The substrate is then transferred into the process chamber 14, which is preferably purged in a similar manner and may further include absorbing gases, or reactive gases as may be desired for the intended application. The radiation source module 12 is also purged to remove any air from the sealed interior region 20 and may further include absorbing gases, if desired. The substrate is then exposed to a broad ultraviolet radiation pattern emitted from the radiation source 22 at an elevated temperature, if desired.

Preferably, the process chamber 14 is configured for automatic substrate handling such that manual handling of the substrate, e.g., wafer, is eliminated.

In one embodiment, the process includes purging the interior region 20 of the radiation source module 12, the process chamber 14, and optionally, the loadlock chamber 16 with one or more inert gases to remove the air prior to exposing the substrate 40 to the ultraviolet radiation pattern and/or remove the air prior to transferring the substrate from the process chamber to the loadlock chamber.

The substrate temperature may be controlled ranging from about room temperature to about 450° C., optionally by an infrared light source, an optical light source, a hot surface, or the light source itself. The process pressure can be less than, greater than, or equal to atmospheric pressure. In one embodiment, the process pressure is at atmospheric. Typically, the UV cured dielectric material is UV treated for no more than or about 300 seconds and, more particularly, between about 60 and about 180 seconds. Also, UV treating can be performed at a temperature between about room temperature and about 450° C.; at a process pressure that is less than, greater than, or about equal to atmospheric pressure; at a UV power between about 0.1 and about 2,000 mW/cm²; and a UV wavelength spectrum between about 100 and about 400 nm. Moreover, the UV cured dielectric material can be UV treated with a process gas purge, such as $N_2$, $O_z$, Ar, He, $H_2$, $H_2O$ vapor, $CO_z$, $C_xH_y$, $C_xF_y$, $C_xH_zF_y$, air, and combinations thereof, wherein x is an integer between 1 and 6, y is an integer between 4 and 14, and z is an integer between 1 and 3.

Suitable low k dielectric materials that can be processed with the above noted apparatus include, but are not intended to be limited to, commonly used spin-on low k dielectric materials and CVD deposited low k dielectric materials. These low k materials can be organic materials, inorganic materials, or combinations thereof. For example, the dielectric material can be a low k dielectric material, a premetal dielectric material, an oxide, a nitride, an oxynitride, a barrier layer, an etch stop material, a capping layer, a high k material, a shallow trench isolation dielectric material or combinations comprising at least one of the foregoing dielectric materials. More particularly, suitable low k dielectric materials can include hydrogen silsesquioxane (HSQ), alkyl silsesquioxane dielectric materials such as MSQ, carbon doped oxide (CDO) dielectric materials, fluorosilicate glasses, diamond-like carbon, parylene, hydrogenated silicon oxy-carbide (Si-COH) dielectric materials, B-staged polymers such as benzocyclobutene (BCB) dielectric materials, arylcyclobutene-based dielectric materials, polyphenylene-based dielectric materials, polyarylene ethers, polyimides, fluorinated polyimides, porous silicas, silica zeolites, porous derivatives of the above noted dielectric materials, and combinations thereof. The porous derivatives, i.e., mesoporous or nanoporous, can have porogen-generated pores, solvent-formed pores, or molecular engineered pores, which may be interconnected or closed, and which may be distributed, random, or ordered, such as vertically oriented pores.

Other suitable dielectrics include, but are not intended to be limited to, silicates, hydrogen silsesquioxanes, organosilsesquioxanes, organosiloxanes, organhydridosiloxanes, silsesquioxane-silicate copolymers, silazane-based materials, polycarbosilanes, and acetoxysilanes.

Suitable substrates include, but are not intended to be limited to, silicon, silicon-on-insulator, silicon germanium, silicon dioxide, glass, silicon nitride, ceramics, aluminum, copper, gallium arsenide, plastics, such as polycarbonate, circuit boards, such as FR-4 and polyimide, hybrid circuit substrates, such as aluminum nitride-alumina, and the like. Such substrates may further include thin films deposited thereon, such films including, but not intended to be limited to, metal nitrides, metal carbides, metal silicides, metal oxides, and mixtures thereof. In a multilayer integrated circuit device, an underlying layer of insulated, planarized circuit lines can also function as a substrate.

EXAMPLES

Figure 12:
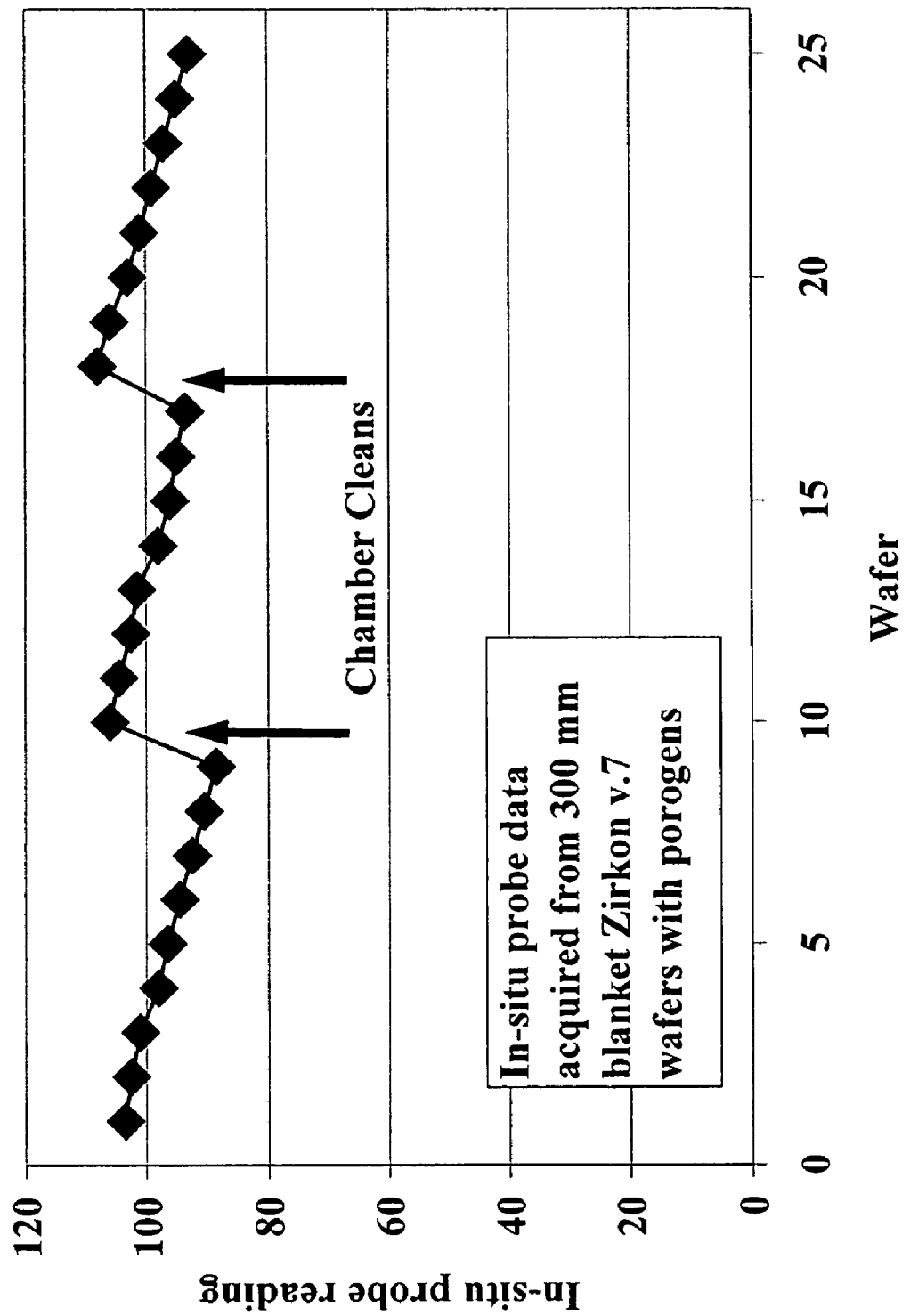
FIG. 12 graphically illustrates transmittance of ultraviolet broadband radiation as a function of substrates processed and periodically cleaning the process chamber.

In this example, multiple substrates including the same dielectric material were processed in the Apparatus as described above. FIG. 12 graphically illustrates the effectiveness of the periodic in situ clean function. The in situ clean process included flowing an oxidizing fluid into the process chamber and exposing the oxidizing fluid to the ultraviolet broadband radiation. The irradiance probe measured intensity of the ultraviolet broadband radiation into the process chamber. As a result of outgassing and contaminant deposition onto the transmissive plate during processing of multiple substrates containing the dielectric material, transmission of the ultraviolet broadband radiation decreases as a function of processed substrates. Periodically cleaning the process chamber cleans the plate so as to substantially restore transmission of the ultraviolet broadband radiation. Advantageously, the walls and other surfaces of the process chamber can also be presumed to have been cleaned in addition to the transmissive plate.

Figure 13:
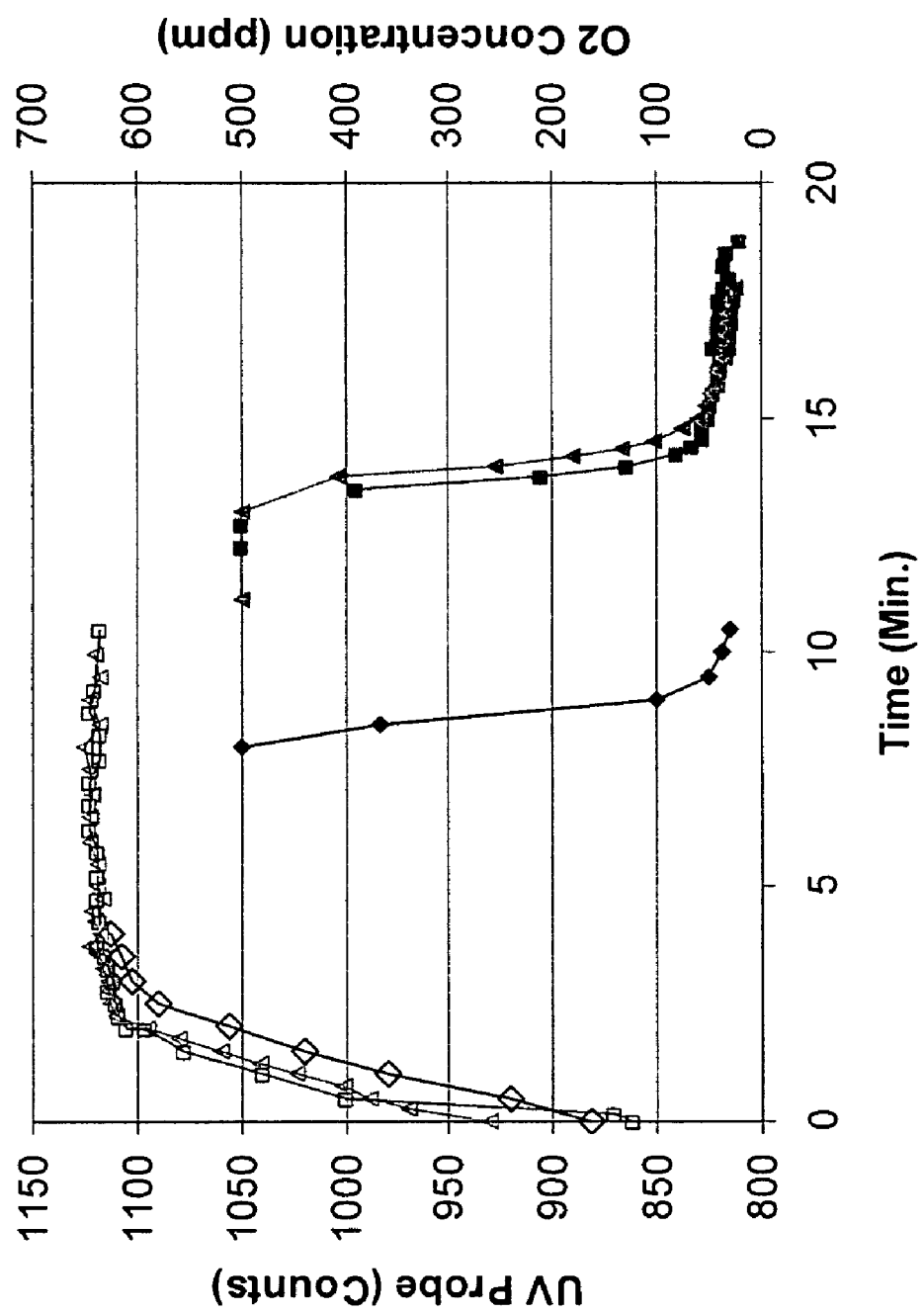
FIG. 13 graphically illustrates transmittance of ultraviolet broadband radiation as a function of time during the in situ clean process and also graphically illustrates concentration of oxygen as a function of time subsequent to the in situ cleaning process and during a process chamber purge.

FIG. 13 graphically illustrates reconditioning of the process chamber after the in situ clean process has been completed. On the left side of the graph, transmittance of the ultraviolet broadband radiation is measured during the in situ clean process described immediately above. After about 5 minutes exposure to the in situ clean process, the plate was substantially cleaned as indicated by the transmittance of the ultraviolet broadband radiation into the process chamber. To remove the oxidizing fluid, the process chamber was the purged with an inert gas. The oxygen probe measured the concentration of oxygen remaining in the process chamber as function of time.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. An apparatus for processing a dielectric material, the apparatus comprising:
a radiation source module comprising a reflector, an ultraviolet radiation source, and a plate transmissive to the wavelengths of about 150 nm to about 300 nm, to define a sealed interior region, wherein the sealed interior region is in fluid communication with a first fluid source;
an optical filter comprising a mesh screen having a plurality of openings;
a process chamber module coupled to the radiation source module to define a sealed chamber in operative communication with the ultraviolet radiation source, the process chamber comprising a closable opening adapted to receive a substrate, a support adapted to support the substrate, and a gas inlet in fluid communication with a second fluid source, wherein the optical filter is intermediate the radiation source and the substrate; and
a loadlock chamber module in operative communication with the process chamber; the loadlock chamber comprising an airlock chamber in fluid communication with a third fluid source and the support.

2. The apparatus of claim 1, wherein the screen comprises an inner zone having a first mesh size, and an outer zone circumferentially disposed about the inner zone having a second mesh size.

3. The apparatus of claim 2, wherein the inner zone is coaxially aligned with the ultraviolet radiation source.

4. The apparatus of claim 1 wherein the sealed interior region of the radiation source module comprises an absorbent gas.

5. The apparatus of claim 1, wherein the ultraviolet radiation source comprises an electrodeless bulb coupled to an energy source.

6. The apparatus of claim 1, wherein the ultraviolet radiation source is a broadband radiation source with a selected wavelength spectrum, adapted to discriminately react with a first set of chemical bonds and functional groups of the dielectric material and is transparent to a second set of selected chemical bonds or functional groups of the dielectric material.

7. The apparatus of claim 1, wherein the ultraviolet radiation source comprises a dielectric barrier discharge device, an arc discharge device, or an electron impact generator.

8. The apparatus of claim 1, wherein the first fluid source comprises an inert gas; an ultraviolet absorbing gas or combinations comprising at least one of the foregoing gases; the second fluid source comprises the inert gas, a reactive gas, the ultraviolet absorbing gas, or a combination comprising at least one of the foregoing gases and the third fluid source comprises the inert gas.

9. The apparatus of claim 1, further comprising a cooling jacket disposed about the reflector in fluid communication with a cooling medium.

10. The apparatus of claim 1, wherein the dielectric material is a low k dielectric material, a premetal dielectric material, oxides, nitrides, oxynitrides, barrier layer materials, etch stop materials, capping layers, high k materials, a shallow trench isolation dielectric material or combinations comprising at least one of the foregoing dielectric materials.

11. The apparatus of claim 1, wherein the process chamber comprises a heat source adapted to heat the substrate.

12. The apparatus of claim 11, wherein the heat source comprises a proximity thermal chuck assembly comprising multiple pins for supporting the substrate and a spring mounted or an embedded thermocouple for measuring a temperature of the substrate.

13. The apparatus of claim 1, wherein the loadlock chamber is adapted to provide an inert condition for the substrate transferred from the process chamber.

14. The apparatus of claim 1, wherein the reflector comprises a reflecting layer formed of an aluminum metal, a dichroic material, or a multilayer coating.

15. The apparatus of claim 14, wherein the reflecting layer further comprises a protective layer comprising at least one of magnesium fluoride, silicon dioxide, aluminum oxide, and combinations thereof 16. The apparatus of claim 1, wherein the ultraviolet radiation source is adapted to emit a broadband radiation pattern comprising wavelengths within a range of about 150 nm to about 300 nm.

17. The apparatus of claim 1, wherein the process chamber further comprises an in situ irradiance probe positioned to measure an intensity of the ultraviolet broadband radiation.

18. The apparatus of claim 1, wherein the sealed interior region of the radiation source module is in fluid communication with an exhaust or vacuum.

19. The apparatus of claim 1, further comprising a preheating station coupled to the process chamber.

20. The apparatus of claim 1, wherein the screen is embedded in the plate and adapted to uniformly disperse the ultraviolet broadband radiation into the process chamber.

21. The apparatus of claim 1, wherein the process chamber further comprises an oxygen sensor.

22. The apparatus of claim 1, wherein the ultraviolet radiation source includes a portion that protrudes into or interfaces with the sealed interior region.

23. The apparatus of claim 22, wherein the portion includes a terminal end formed of a wire mesh.

24. An apparatus for processing a dielectric material, the apparatus comprising:
a radiation source module comprising a reflector, an ultraviolet radiation source adapted to emit broadband radiation, a plate transmissive to the wavelengths of about 150 nm to about 300 nm nm, to define a sealed interior region, wherein the sealed interior region is in fluid communication with a first fluid source;
an optical filter comprising a mesh screen disposed between the radiation source and a substrate; and
a process chamber module coupled to the radiation source module to define a sealed chamber in operative communication with the ultraviolet radiation source, the process chamber comprising a closable opening adapted to receive the substrate, a support adapted to support the substrate, and a gas inlet in fluid communication with a second fluid source.

25. The apparatus of claim 24, wherein the mesh screen comprises an inner zone having a first mesh size, and an outer zone circumferentially disposed about the inner zone having a second mesh size.

26. The apparatus of claim 25, wherein the inner zone is coaxially aligned with the ultraviolet radiation source.

27. The apparatus of claim 25, further comprising at least one additional zone circumferentially about the outer zone and having a mesh size different from the second mesh size.

28. The apparatus of claim 24, wherein the sealed interior region of the radiation source module comprises, an absorbent gas.

29. The apparatus of claim 24, wherein the broadband radiation comprises a pattern of wavelengths within a range of about 150 nm to about 300 nm.

30. A process for treating a dielectric material, comprising:
transferring a substrate having a dielectric material thereon from a loadlock chamber into a process chamber, wherein the process chamber is coupled to a radiation source module comprising a reflector, an ultraviolet radiation source, and a plate to define a sealed interior region, wherein the plate is transmissive to wavelengths of about 150 nm to about 300 nm
flowing an inert gas into the process chamber and the sealed interior region;
heating the substrate to a temperature within a range from 20° C. to 450° C.;
generating ultraviolet broadband radiation at wavelengths of about 150 nm to about 300 nm nm and exposing the substrate to the ultraviolet broadband radiation;
transferring the heated substrate at an elevated temperature to the loadlock chamber, and cooling the heated substrate while maintaining an inert atmosphere within the loadlock chamber; and
periodically cleaning the process chamber comprising introducing an oxidizing fluid into the process chamber, activating the oxidizing fluid with the ultraviolet broadband radiation, and volatilizing contaminants from the plate and process chamber.

31. The process of claim 30, further comprising flowing a cooling medium about the reflector.

32. The process of claim 30, wherein exposing the substrate to the ultraviolet broadband radiation comprises flowing an ultraviolet absorbing gas into the sealed interior region to remove a portion of the ultraviolet broadband radiation transmitted to the substrate.

33. The process of claim 30, wherein exposing the substrate to the ultraviolet broadband radiation further comprises simultaneously flowing a reactive gas into the process chamber.

34. The process claim 30, wherein periodically cleaning the process chamber comprises detecting a change in transmission of the ultraviolet broadband radiation into the process chamber, wherein when the change exceeds a predetermined threshold value, the cleaning process is triggered.

35. The process of claim 34, wherein the cleaning process is discontinued when a rate of change of transmission falls below a predetermined rate of change or is at about 100% transmission for a predefined wavelength band.

36. The process of claim 30, further comprising filtering a portion of the ultraviolet broadband radiation prior to exposing the substrate.

37. The process of claim 36, wherein filtering the portion of the ultraviolet broadband radiation comprises disposing a coating, an absorbent gas, an absorbent solid material or a combination thereof in a pathway of the ultraviolet broadband radiation.

38. The process of claim 30, wherein exposing the substrate to the ultraviolet broadband radiation comprises disposing a mesh screen between the ultraviolet radiation source and the process chamber, wherein a portion of the ultraviolet broadband radiation transmitted to the substrate is removed by the filter.

39. The process of claim 30, wherein the dielectric material comprises a premetal dielectric material, a low k dielectric material, a barrier layer, and combinations comprising one or more of the foregoing dielectric materials.

40. The process of claim 30, wherein flowing the inert gas into the process chamber comprises a downflow direction.

41. The process of claim 30, wherein flowing the inert gas into the process chamber comprises a crossflow direction.

42. The process of claim 30, wherein generating the ultraviolet broadband radiation comprises exciting a gas fill with an electrodeless bulb coupled to an energy source.

43. The process of claim 42, wherein the energy source is microwave energy, radiofrequency energy, or a combination of the foregoing energy sources.

44. The process of claim 30, further comprising flowing a gas proximal to the plate within the process chamber in an amount and flow rate effective to minimize deposition of a porogen or any outgassed material from a substrate to the plate.

45. The process of claim 30, further comprising flowing a gas proximal to the plate within the process chamber in an amount and flow rate effective to clean the plate, wherein the gas is activated by the ultraviolet broadband radiation.

46. The process of claim 30, further comprising continuously or periodically monitoring an oxygen concentration in the process chamber.

47. The process of claim 46, further comprising maintaining the oxygen concentration in the process chamber to less than 100 parts per million.

* * * * *